US008261230B2

(12) United States Patent
Huang et al.

(10) Patent No.: US 8,261,230 B2
(45) Date of Patent: Sep. 4, 2012

(54) SYSTEM AND METHOD FOR OPTIMIZING CURRENT OVERLOAD PROTECTION CIRCUIT

(75) Inventors: Tsung-Sheng Huang, Taipei Hsien (TW); Chun-Jen Chen, Taipei Hsien (TW); Duen-Yi Ho, Taipei Hsien (TW); Wei-Chieh Chou, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 233 days.

(21) Appl. No.: 12/774,685

(22) Filed: May 5, 2010

(65) Prior Publication Data

US 2011/0238233 A1  Sep. 29, 2011

(30) Foreign Application Priority Data

Mar. 23, 2010 (TW) .............................. 99108595 A

(51) Int. Cl.
*G06F 17/50* (2006.01)
*G06F 9/455* (2006.01)
*G05D 17/00* (2006.01)

(52) U.S. Cl. ........ 716/139; 716/106; 716/112; 716/122; 716/132; 716/133; 716/136; 700/286; 700/295; 700/298

(58) Field of Classification Search .................. 716/106, 716/112, 122, 132, 133, 136, 139; 700/286, 700/292, 295, 298
See application file for complete search history.

(56) References Cited

U.S. PATENT DOCUMENTS

| | | | |
|---|---|---|---|
| 6,629,044 B1 * | 9/2003 | Papallo et al. ................. 702/60 |
| 7,024,646 B2 * | 4/2006 | Logie et al. .................. 716/115 |
| 7,096,165 B2 * | 8/2006 | Pantenburg et al. .............. 703/1 |
| 7,418,375 B2 * | 8/2008 | Iimori .............................. 703/14 |
| 7,434,179 B2 * | 10/2008 | Hayashi ........................ 716/106 |
| 7,586,299 B2 * | 9/2009 | Fujiyama et al. .............. 323/350 |
| 7,636,650 B2 * | 12/2009 | Khalil ............................... 703/1 |
| 7,779,371 B2 * | 8/2010 | Lottmann ..................... 716/112 |
| 7,840,396 B2 * | 11/2010 | Radibratovic et al. .......... 703/18 |
| 7,860,615 B2 * | 12/2010 | Nelson et al. ................. 700/286 |
| 8,095,908 B2 * | 1/2012 | Lottmann ..................... 716/136 |
| 2002/0053066 A1 * | 5/2002 | Richter et al. .................... 716/5 |
| 2006/0143587 A1 * | 6/2006 | Boutin et al. ................... 716/18 |
| 2008/0103631 A1 * | 5/2008 | Koliwad et al. ............... 700/286 |
| 2008/0120579 A1 * | 5/2008 | Lottmann ........................ 716/5 |
| 2009/0149972 A1 * | 6/2009 | Nasle ............................. 700/80 |
| 2009/0281676 A1 * | 11/2009 | Beavis et al. ................. 700/295 |
| 2009/0319251 A1 * | 12/2009 | Ito et al. ......................... 703/14 |
| 2010/0010684 A1 * | 1/2010 | Lorenz et al. ................. 700/293 |
| 2011/0126165 A1 * | 5/2011 | Stebnicki et al. ............. 716/122 |
| 2011/0145773 A1 * | 6/2011 | Best et al. ..................... 716/112 |
| 2011/0307223 A1 * | 12/2011 | Khalil ............................... 703/1 |

* cited by examiner

*Primary Examiner* — Helen Rossoshek
(74) *Attorney, Agent, or Firm* — Altis Law Group, Inc.

(57) ABSTRACT

A system for optimizing a current overload protection circuit includes an input device, a data storage device, a central processing device, and a display. The central processing device includes a storage module, a control module, and a calculation module. The storage module stores a VI application therein. The control module receives instructions from the input device and selects virtual electronic components of the current overload protection circuit from the data storage device and connection of the selected electronic components. The current overload protection circuit is completed and run in the VI application; electronic components significantly affecting the maximum protection current are labeled. The calculation module calculates normal distribution samples of the current overload protection circuit based on the labeled electronic components. The display shows whether the current overload protection circuit meets a process capability standard.

8 Claims, 4 Drawing Sheets

SYSTEM AND METHOD FOR OPTIMIZING CURRENT OVERLOAD PROTECTION CIRCUIT

BACKGROUND

1. Technical Field

The present disclosure relates to circuit optimization and, particularly, to a system and method for optimizing current overload protection circuit.

2. Description of Related Art

Current overload protection circuits often consist of various electronic components such as resistors, capacitors, and comparators. If ambient temperature, humidity, air pressure, or other factors change, parameters of the electronic components may change as well, adversely affecting the maximum protection current of the current overload protection circuit, such that the reliability of the current overload protection circuit is reduced.

Therefore, it is desirable to provide a system and a method for optimizing a current overload protection circuit, which can overcome the limitations described.

DETAILED DESCRIPTION

Embodiments of the disclosure are now described in detail with reference to the drawings.

Figure 1:
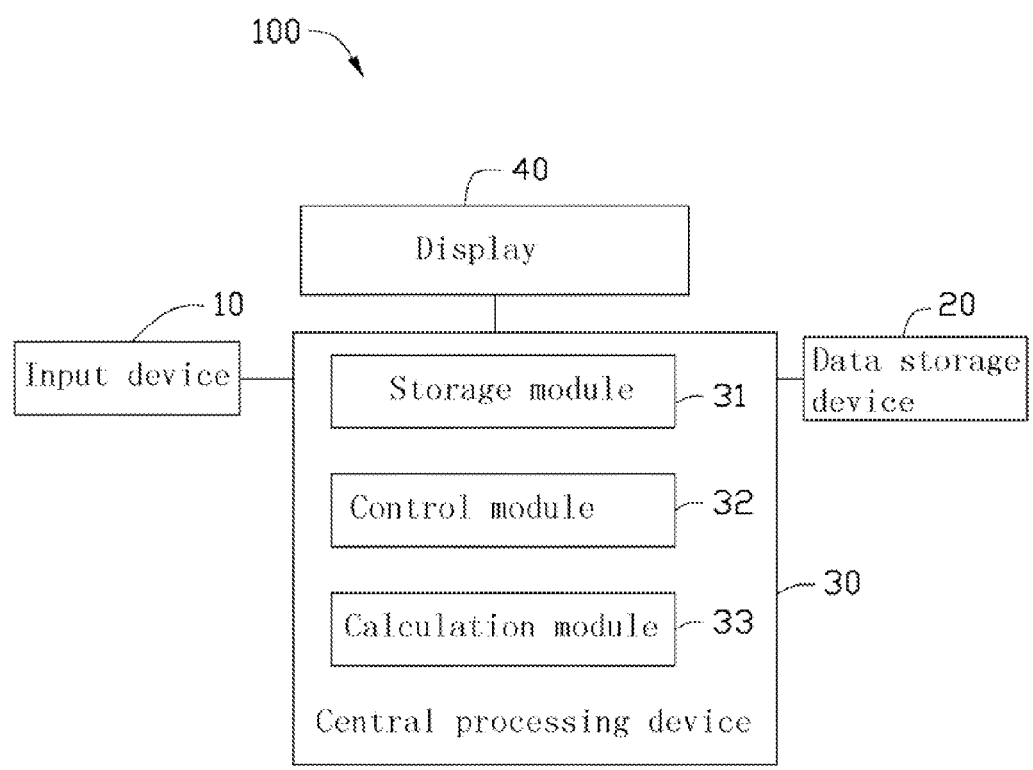
FIG. 1 is a block diagram of an exemplary embodiment of a system for optimizing a current overload protection circuit.

Referring to FIG. 1, a system 100 for optimizing a current overload protection circuit, according to one exemplary embodiment, includes an input device 10, a data storage device 20, a central processing device 30, and a display 40.

The input device 10 can be but is not limited to a keyboard or a mouse. The input device 10 is configured for enabling data and control input, which may include selections of virtual electronic components of a current overload protection circuit to be optimized and connections of the electronic components. The electronic components can be a virtual resistor, a virtual capacitor, a virtual inductor, or a virtual voltage regulator.

The data storage device 20 includes a database and communicates with the central processing device 30 via database connectivity, such as open database connectivity (ODBC) or java database connectivity (JDBC). The database stores a plurality of virtual electronic components and metadata thereof. The metadata of each of the virtual electronic components may include standard values, such as resistance, capacitance, and inductance, and relative errors of the standard value under different environments. For example, the standard value of a resistor is about 1200 ohms ($\Omega$) and a relative error of the resistor is 1% under a specific environment. As such, a real value of the resistor under this specific environment is about $1200+1200*1\%=1320\Omega$.

The central processing device 30 is configured for processing the instructions output from the input device 10. In this embodiment, the central processing device 30 is, but is not limited to, a computer. The central processing device 30 includes a storage module 31, a control module 32, and a calculation module 33.

The storage module 31 stores a virtual instrument (VI) application which can complete and run the current overload protection circuit therein. In this embodiment, the storage module 31 pre-stores an upper limit La and a lower limit Lb of the maximum protection current of the current overload protection circuit therein, wherein the upper limit La is the maximum magnetic saturation current of a loop circuit to which the current overload protection circuit is applied, and the lower limit Lb is a full load current of the loop circuit.

The control module 32 is configured for receiving the instructions output from the input device 10, and selecting the electronic components of the current overload protection circuits from the database of the data storage device 20. The control module 32 completes the current overload protection circuit based on the connected relation instructions output from the input device 10. After the current overload protection circuit is completed and run in the VI application, the electronic components which significantly affecting the maximum protection current of the current overload protection circuit are labeled. In this embodiment, the labeled electronic components are the electronic components of a formula of the maximum protection current, and the formula is calculated by the VI application.

The calculation module 33 calculates an average value and a standard deviation of the labeled electronic components based on the standard values and the relative errors. The average value of one of the electronic components is the sum of different values under different environments divided by the number of environments. The standard deviation value of the electronic component can be calculated using a standard deviation formula. Consequently, the calculation module 33 generates normal distribution samples for each labeled electronic component based on calculated average values and standard deviations, and calculates normal distribution samples of the maximum protection current of the current overload protection circuit based on the normal distribution samples of the labeled electronic components.

The display 40 can be a monitor, and receives the normal distribution samples of the maximum protection current output from the calculation module 33. The display 40 is configured for displaying a normal distribution diagram based on the normal distribution samples of the maximum protection current. The upper limit La and the lower limit Lb are displayed on the display 40 cooperate with the normal distribution diagram of the maximum protection current.

If the normal distribution diagram of the maximum protection current is located between the upper limit La and the lower limit Lb, the current overload protection circuit is qualified. If the current overload protection circuit is not qualified, the control module 32 reselects the electronic components according to the instructions consequently input from the input device 10 and replaces the labeled electronic components with the reselected electronic components in the current overload protection circuit. The reselected electronic components have the same types and standard values as the replaced electronic components, but the relative errors of the reselected electronic components are different from those of the replaced electronic components. As such, the current overload protection circuit is renewed. The renewed current overload protection circuit is analyzed by the central processing device 30 again.

Figure 2:
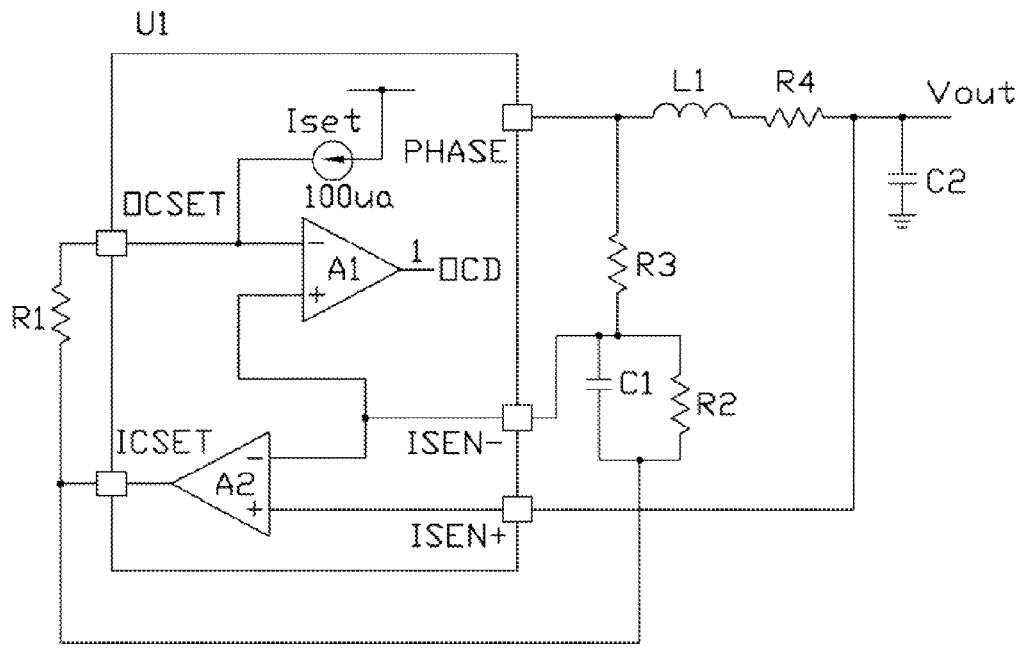
FIG. 2 is a circuit diagram of one example of a current overload protection circuit that may be analyzed using the system of FIG. 1.

FIG. 2, is a circuit diagram of one example of a current overload protection circuit that may be analyzed using the system of the present disclosure. The current overload protection circuit includes a first resistor R1, a second resistor R2, a third resistor R3, a first capacitor C1, a second capacitor C2, an inductor L1, and a voltage regulator U1; the internal resistor of the inductor L1 is R4. A first comparator A1, a second comparator A2, and a current source Iset are built in the voltage regulator U1. The voltage regulator U1 includes a PHASE terminal, a ISEN- terminal, a ISEN+terminal, a OCSET terminal. One terminal of the inductor L1 is coupled to the PHASE terminal, and the other terminal is coupled to a voltage acquiring terminal Vout. One terminal of the second capacitor C2 is coupled to the voltage acquiring terminal Vout, and the other terminal is grounded. The third resistor R3 is coupled between the PHASE terminal and the ISEN-terminal. The first capacitor C1 is coupled between the ISEN- terminal and the ISENO terminal. The second resistor R2 is connected in parallel with the first capacitor C1. The first resistor R1 is coupled between the OCSET terminal and the ISENO terminal. The positive and negative terminals of the first comparator A1 are coupled to the ISEN-terminal and the OCSET terminal respectively, and the output terminal of the first comparator A1 is coupled to a triggering terminal OCD. The current source Iset is coupled to the negative terminal of the first comparator A1. The positive and negative terminals of the second comparator A2 are coupled to the ISEN+ terminal and the ISEN-terminal respectively, the output terminal of the second comparator A2 is coupled to the ISENO terminal. The maximum protection current Iocp of the current overload protection circuit satisfies the following formula:

$$Iocp = \frac{R1 * Iset * R3}{R2 * R4}$$

The electronic components selected by the control module 32 from the data storage device 20 according to the current overload protection circuit of FIG. 2, and the current overload protection circuit is completed and run in the VI application. The electronic components which significantly affecting the maximum protection current of the current overload protection circuit are labeled. In this embodiment, the labeled electronic components are the electronic components of the formula.

TABLE 1

Relative errors of the labeled electronic components under different environments

| Environment | R1 | R2 | R3 | R4 | Iset |
|---|---|---|---|---|---|
| Factory | 1% | 1% | 1% | 7% | 7% |
| Temperature change | 0.6% | 0.6% | 0.6% | 0 | 0 |
| Aging | 2% | 2% | 2% | 0 | 0 |
| Welding | 3% | 3% | 3% | 0 | 0 |
| Temperature cycle | 0.75% | 0.75% | 0.75% | 0 | 0 |
| Humidity | 3% | 3% | 3% | 0 | 0 |
| Low-temperature | 1% | 1% | 1% | 0 | 0 |
| High-temperature | 0.5% | 0.5% | 0.5% | 0 | 0 |
| Thermal | 0.5% | 0.5% | 0.5% | 0 | 0 |
| Thermal shock | 0.5% | 0.5% | 0.5% | 0 | 0 |

The average values and standard deviations of the first resistor R1, the second resistor R2, the third resistor R3, the internal resistor R4, and the current source Iset are calculated based on the standard values and the relative errors thereof. If standard deviations of the first resistance R1, the second resistance R2, the third resistor R3, the internal resistor R4, and the current source Iset are σ1, σ2, σ3, σ4, σ5; the average values of the first resistance R1, the second resistance R2, the third resistor R3, the internal resistor R4, and the current source Iset are V1, V2, V3, V4, V5; the relative errors of the first resistance R1, the second resistance R2, the third resistor R3, the internal resistor R4, and the current source Iset under different environments are $a_i$, $b_i$, $c_i$, $d_i$, $e_i$ as shown in table 1; the number of the environments is n as shown in table 1.

Therefore, $$\sigma1 = V1 * \sqrt{\frac{\sum_{i=1}^{n}(a_i)^2}{n-1}}, \quad \sigma2 = V2 * \sqrt{\frac{\sum_{i=1}^{n}(b_i)^2}{n-1}},$$

$$\sigma3 = V3 * \sqrt{\frac{\sum_{i=1}^{n}(c_i)^2}{n-1}}, \quad \sigma4 = V4 * \sqrt{\frac{\sum_{i=1}^{n}(d_i)^2}{n-1}}, \quad \sigma5 = V5 * \sqrt{\frac{\sum_{i=1}^{n}(e_i)^2}{n-1}}.$$

In this embodiment, the average values of the first resistance R1, the second resistance R2, the third resistor R3, the internal resistor R4, and the current source Iset are V1=1300Ω, V2=18000Ω, V3=18000Ω, V4=1.40 mΩ, and V5=100 uA respectively; the standard deviations of the first resistance R1, the second resistance R2, the third resistor R3, the internal resistor R4, and the current source Iset are σ1=21.97Ω, σ2=304.2Ω, σ3=304.2Ω, σ4=0.0327 mΩ, and σ5=2.333 uA respectively.

The calculation module 33 generates normal distribution samples of the first resistance R1, the second resistance R2, the third resistor R3, the internal resistor R4, and the current source Iset based on the average values and standard deviations. In this embodiment, the number of the normal distribution samples of each the five values (R1, R2, R3, R4, Iset) is 10,000, and each sample of the five values comprises a team. E.g. R1=1299Ω, 1302Ω, 1301Ω . . . , R2=18010Ω, 17995Ω, 17998Ω . . . , R3=18010Ω, 17995Ω, 17998Ω . . . , R4=1.41 mΩ, 1.39 mΩ, 1.42 mΩ . . . , Iset=101 mA, 102 mA, 99 mA, etc. The random teams are (R1=1302Ω, R2=18010Ω, R3=18005Ω, R4=1.41 mΩ, Iset=101 mA), (R1=1301Ω, R2=18012Ω, R3=18007Ω, R4=1.42 mΩ, Iset=100 mA), (R1=1298Ω, R2=17995Ω, R3=18005Ω, R4=1.43 mΩ, Iset=97 mA), etc.

The calculation module 33 calculates normal distribution samples of the maximum protection current of the current overload protection circuit based on the formula and the random teams, and the 10000 values of the maximum protection current Iocp of the current overload protection circuit are obtained.

Figure 3:
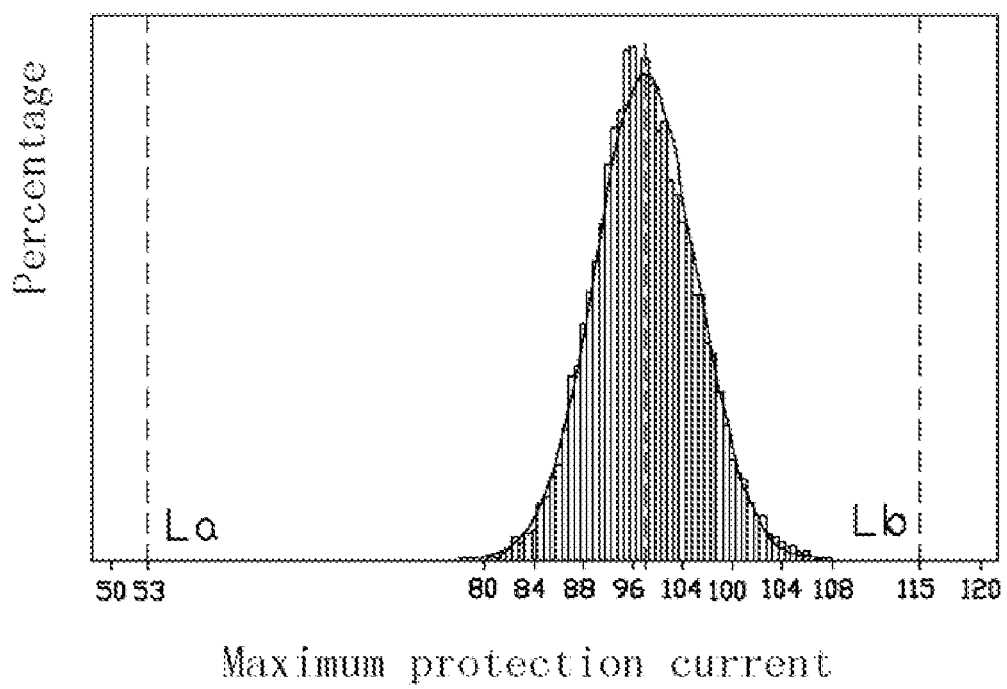
FIG. 3 is one example of a maximum protection current distribution diagram of the circuit of FIG. 2.

Referring to FIG. 3, the graphics display module 40 receives the calculated maximum protection current Iocp of the current overload protection circuit and displays a distribution diagram. A horizontal ordinate of the distribution diagram indicates the calculated maximum protection currents of the current overload protection circuit, a longitudinal ordinate indicates percentages of the different calculated current number of the total calculated maximum protection currents count. For example. a horizontal ordinate may be 96A, the number of the 96A current 8200, the total current 10000, and the longitudinal ordinate is 8200/10000=0.82. The upper limit and lower limit of the current overload protection circuit are La=53A and Lb=115A respectively. The distribution diagram of the maximum protection current of the current overload circuit is located between the upper limit La and lower limit Lb. Therefore, this current overload protection circuit meets a desired reliability standard.

Figure 4:
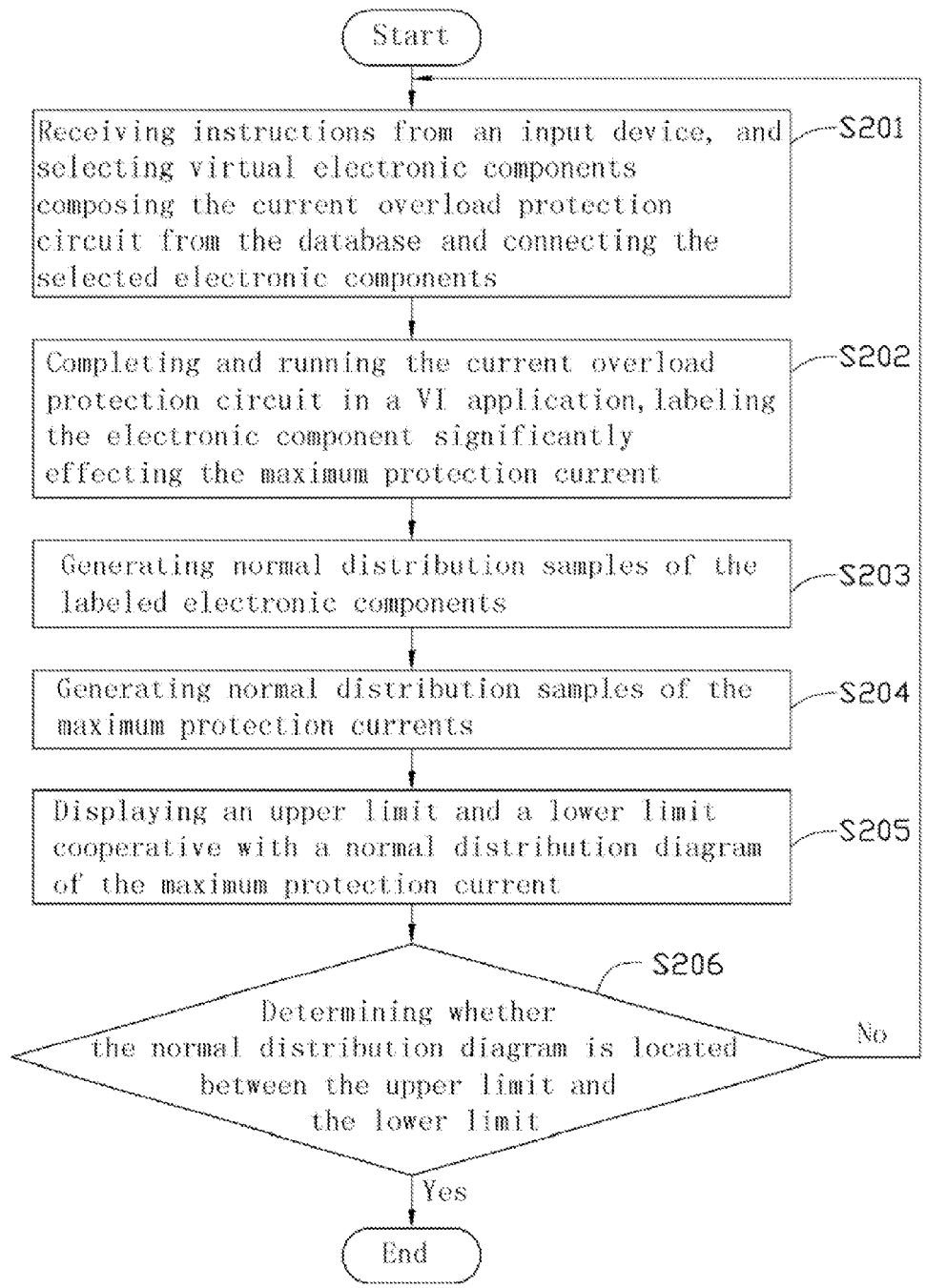
FIG. 4 is a flowchart of an exemplary embodiment of a method for optimizing a current overload protection circuit.

Referring to FIG. 4, an exemplary embodiment of a method for optimizing a current overload protection circuit as follows.

In step S201, the control module 32 of the central processing device 30 receives the instructions from the input device 10, and selects virtual electronic components of a current overload protection circuit from the database of the data storage device 20 and connects the selected electronic components.

In step S202, the current overload protection circuit is completed and run in a virtual instrument (VI) application stored in the storage module 31; the electronic components which significantly affecting the maximum protection current of the current overload protection circuit are labeled.

In step S203, the calculation module 33 calculates average values and standard deviations of the labeled electronic components based on standard values and relative errors thereof. Then, the calculation module 33 generates normal distribution samples of the labeled electronic components based on average values and standard deviations.

In step S204, the calculation module 33 calculates the maximum protection currents based on the normal distribution samples of the labeled electronic components, and generates normal distribution samples of the maximum protection currents.

In step S205, the display 40 displays a normal distribution diagram of the maximum protection currents based on the normal distribution samples of the maximum protection current, and an upper limit La and a lower limit Lb cooperative display with the normal distribution diagram of the maximum protection current. The upper limit La and the lower limit Lb of the maximum protection current are pre-stored in the storage module 31, wherein the upper limit La is a maximum magnetic saturation current of the loop circuit including the current overload protection circuit, the lower limit Lb is a full load current of the loop circuit.

In step S206, if the normal distribution diagram of the maximum protection current is located between the upper limit La and the lower limit Lb, the current overload protection circuit is qualified. If the current overload protection circuit is not qualified, step S201 is repeated.

It will be understood that the above particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A system for optimizing a current overload protection circuit data, comprising:
    an input device configured for inputting instructions of selecting virtual electronic components of a current overload protection circuit data and connecting the selected electronic components, the current overload protection circuit data having a maximum protection current;
    a data storage device configured for storing a plurality of virtual electronic components and metadata thereof, the metadata of each of the electronic components comprising a standard value and relative errors of the standard value under different environments;
    a central processing device comprising:
        a storage module storing a virtual instrument (VI) application therein; the storage module pre-storing an upper limit and a lower limit of the maximum protection current;
        a control module configured for receiving the instructions output from the input device, and selecting the electronic components of the current overload protection circuits data from the database of the data storage device and connecting the selected electronic components to obtain the current overload protection circuit data; the current overload protection circuit data being configured to be run in the VI application, the electronic components which significantly affecting the maximum protection current of the current overload protection circuit data being labeled after the current overload protection circuit data is run in the VI application; wherein the labeled electronic components are the electronic components of a formula of the maximum protection current, and the formula is calculated by the VI application; and
        a calculation module configured for calculating normal distribution samples of the labeled electronic components based on the standard values and the relative errors thereof; and calculating normal distribution samples of the maximum protection current of the current overload protection circuit data; and
    a display configured for displaying a normal distribution diagram based on the normal distribution samples of the maximum protection current; the upper limit and the lower limit displayed on the display cooperative with the normal distribution diagram.

2. The system of claim 1, wherein the data storage device comprises a database communicating with the central processing device via database connectivity.

3. The system of claim 1, wherein the upper limit is a maximum magnetic saturation current of the loop circuit including the current overload protection circuit data, the lower limit is a full load current of the loop circuit.

4. The system of claim 1, wherein the calculation module calculates average values and standard deviations of the labeled electronic components based on the standard values and the relative errors; and generates normal distribution samples of the labeled electronic components based on the average values and the standard deviations.

5. A method for optimizing a current overload protection circuit data, comprising:
    receiving instructions from an input device, and selecting virtual electronic components of the current overload protection circuit data from the database of a data storage device and connecting the selected electronic components to obtain the current overload protection circuit data, the data storage device storing metadata of the virtual electronic components, the metadata of each of the virtual electronic components comprising a standard value and relative errors of the standard value under different environments, the current overload protection circuit data having a maximum protection current;
    running the current overload protection circuit data via a VI application stored in a storage module, the storage module pre-storing an upper limit and a lower limit of the maximum protection current; the electronic components which significantly affecting the maximum protection current of the current overload protection circuit data being labeled;
    calculating normal distribution samples of the labeled electronic components based on the standard values and the relative errors thereof;

calculating the maximum protection currents based on the normal distribution samples of the labeled electronic components, and generating normal distribution samples of the maximum protection currents; wherein the labeled electronic components are the electronic components of a formula of the maximum protection current, and the formula is calculated by the VI application;

displaying a normal distribution diagram based on the normal distribution samples of the maximum protection current on a monitor; the upper limit and the lower limit displayed on the monitor cooperative with the normal distribution diagram;

determining whether the normal distribution diagram is located between the upper limit and the lower limit.

6. The method of claim 5, wherein if the normal distribution diagram of the maximum protection current is located between the upper limit and the lower limit, the current overload protection circuit data is qualified; if the current overload protection circuit data is not qualified, receipt of instruction from the input device is repeated.

7. The method of claim 5, wherein average values and standard deviations of the labeled electronic components are calculated based on the standard values and the relative errors; and normal distribution samples of the labeled electronic components are generated based on the average values and the standard deviations.

8. The method of claim 5, wherein the upper limit is a maximum magnetic saturation current of the loop circuit including the current overload protection circuit data, the lower limit is a full load current of the loop circuit.

* * * * *